(12) United States Patent
Banine et al.

(10) Patent No.: US 8,094,288 B2
(45) Date of Patent: Jan. 10, 2012

(54) LITHOGRAPHIC APPARATUS AND DEVICE MANUFACTURING METHOD

(75) Inventors: Vadim Yevgenyevich Banine, Helmond (NL); Johannes Hubertus Josephina Moors, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 1630 days.

(21) Appl. No.: 10/842,637

(22) Filed: May 11, 2004

(65) Prior Publication Data

US 2005/0254029 A1   Nov. 17, 2005

(51) Int. Cl.
*G03B 27/52* (2006.01)
*G03B 27/54* (2006.01)

(52) U.S. Cl. ............. 355/53; 430/311; 355/30; 355/70; 250/492.2

(58) Field of Classification Search .................. None
See application file for complete search history.

(56) References Cited

U.S. PATENT DOCUMENTS

| 6,538,716 | B2 * | 3/2003 | Mulkens et al. | 355/30 |
|---|---|---|---|---|
| 2002/0014598 | A1 | 2/2002 | Melnychuk et al. | |
| 2002/0071468 | A1 | 6/2002 | Sandstrom et al. | |
| 2003/0015669 | A1 | 1/2003 | Janos et al. | |
| 2004/0099816 | A1 * | 5/2004 | Roux | 250/492.2 |
| 2004/0160583 | A1 * | 8/2004 | Mulkens et al. | 355/30 |

FOREIGN PATENT DOCUMENTS

| EP | 1 020 897 A1 | 7/2000 |
|---|---|---|
| EP | 1 460 479 A2 | 9/2004 |
| KR | 2001-0023314 | 3/2001 |
| KR | 2001-0109188 | 12/2001 |
| KR | 2004-0030268 | 4/2004 |
| WO | 2004/021086 A1 | 3/2004 |

OTHER PUBLICATIONS

Office Action in related European Application No. 05 103 924.6-1226 dated May 17, 2010.

* cited by examiner

*Primary Examiner* — Daborah Chacko Davis
(74) *Attorney, Agent, or Firm* — Pillsbury Winthrop Shaw Pittman LLP (57) ABSTRACT

A lithographic apparatus includes an illumination system configured to transmit a beam of radiation, the beam of radiation comprising desired radiation having a predetermined wavelength or a predetermined wavelength range, and undesired radiation having another wavelength or another wavelength range; a support structure configured to support a patterning structure, the patterning structure being configured to impart the beam of radiation with a pattern in its cross-section; a substrate table configured to hold a substrate; and a projection system configured to project the patterned beam of radiation onto a target portion of the substrate; wherein at least part of the lithographic apparatus, in use, includes a gas substantially transmissive for at least part of the desired radiation and substantially less transmissive for at least part of the undesired radiation.

35 Claims, 2 Drawing Sheets

LITHOGRAPHIC APPARATUS AND DEVICE MANUFACTURING METHOD

BACKGROUND OF THE INVENTION

1. Field of Invention

This invention relates to a lithographic apparatus, a method for diminishing an intensity of undesired radiation in a beam of radiation in an optical system, for example in a lithographic apparatus, a device manufacturing method, the use of a gas in an optical system, and a device.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatuses include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatuses employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources include, for instance, laser-produced plasma sources, discharge plasma sources, or synchrotron radiation from electron storage rings.

Some extreme ultraviolet sources, especially plasma sources, emit radiation over a wide range of frequencies, even including infrared (IR), visible, ultraviolet (UV) and deep ultraviolet (DUV). These unwanted frequencies will propagate and cause heating problems in the illumination and projection systems and cause unwanted exposure of the resist if not blocked; although the multilayer mirrors of the illumination and projection systems are optimized for reflection of the desired wavelength, e.g. 13 nm, they are optically flat and have quite high reflectivities at IR, visible and UV wavelengths. It is therefore desirable to select from the source a relatively narrow band of frequencies for the projection beam. Even where the source has a relatively narrow emission line, it is desirable to reject radiation out of that line, especially at longer wavelengths. It has been proposed to use a thin membrane as a filter to perform this function. However, such a film is very delicate and becomes very hot, 200-300° C. or more, leading to high thermal stresses and cracking, sublimation and oxidation in the high power levels necessary in a lithographic projection apparatus. A membrane filter also generally absorbs at least 50% of the desired radiation.

EP 1197803 describes a lithographic projection apparatus wherein a grating spectral filter is used in the radiation system of the lithographic projection apparatus. This grating spectral filter is designed for passing radiation of desired wavelengths to form a projection beam and for deflecting radiation of undesired wavelengths. The grating spectral filter is substantially formed of a material having a complex refractive index close to unity at the desired wavelengths and includes silicon protrusions (this structure is 'invisible' for the EUV radiation). The protrusions have a laminar saw tooth profile or a laminar square wave profile (FIGS. 3 and 4 of EP 1197803, respectively).

However, the grating spectral filter of EP 1197803, but also other gratings, may lead to a large loss in reflectivity, also of the desired radiation. For example, loss of radiation intensity can amount up to 50% or more.

SUMMARY OF THE INVENTION

It is therefore an aspect of the invention to provide an alternative optical filter in an optical system, e.g. a lithographic apparatus, wherein the optical filter may e.g. induce less intensity loss of desired radiation. It is further an aspect of the invention to provide a method for diminishing an intensity of undesired radiation in a beam of radiation in an optical system, as well as a device manufacturing method, wherein optical filters are used that may, e.g., induce less intensity loss of desired radiation.

According to the present invention, in an embodiment of the invention there is provided a lithographic apparatus including:

a source for providing radiation, the radiation comprising desired radiation having a predetermined wavelength or a predetermined wavelength range, and undesired radiation having another wavelength or wavelength range;

an illumination system for providing a beam of radiation;

a support structure for supporting a patterning structure, the patterning structure serving to impart the projection beam with a pattern in its cross-section;

a substrate table for holding a substrate; and a projection system for projecting the patterned beam onto a target portion of the substrate;

characterized in that at least part of the lithographic apparatus, in use, comprises a gas substantially transmissive for at least part of the desired radiation and substantially less transmissive for at least part of the undesired radiation.

In an embodiment of the invention, there is provided a lithographic apparatus including:

an illumination system configured to transmit a beam of radiation, the beam of radiation including desired radiation having a predetermined wavelength or a predetermined wavelength range, and undesired radiation having another wavelength or another wavelength range;

a support structure configured to support a patterning structure, the patterning structure being configured to impart the beam of radiation with a pattern in its cross-section;

a substrate table configured to hold a substrate; and a projection system configured to project the patterned beam of radiation onto a target portion of the substrate;

wherein at least part of the lithographic apparatus, in use, includes a gas substantially transmissive for at least part of the desired radiation and substantially less transmissive for at least part of the undesired radiation.

The terms "radiation" and "beam" used herein encompass all types of electromagnetic radiation, including ultraviolet (UV) radiation (e.g. having a wavelength λ of about 365, 248, 193, 157 or 126 nm) and extreme ultra-violet (EUV) radiation (e.g. having a wavelength in the range of about 5-20 nm), as well as particle beams, such as ion beams or electron beams. Generally, radiation having wavelengths between about 780-3000 nm (or larger) is considered IR radiation. UV refers to radiation with wavelengths of approximately 100-400 nm; within lithography, it is usually also applied to the wavelengths which can be produced by a mercury discharge lamp: G-line 436 nm; H-line 405 nm; I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm.

"Undesired radiation" or "undesired wavelength" refers to radiation having wavelengths larger (or smaller) than the wavelength that is intended to be used. For example, when EUV radiation with a wavelength λ of about 13.5 nm is desired, radiation with a wavelength smaller than about 10 nm or larger than about 20 nm is undesired; more preferably radiation not having wavelengths in the range of about 13.5 nm +/−2%, is undesired radiation. This means that the phrase "radiation with wavelength λ" is not intended to be limited to radiation with an infinite small bandwidth of λ, as will be clear to the person skilled in the art. An optical element may be designed, and a gas may be used, for one specific wavelength λ or a range of wavelengths. The term "in-band EUV" refers to EUV radiation having a wavelength in the range of about 10-16 nm, especially about 13.5 nm +/−2%; out-band EUV is radiation having a wavelength smaller or larger than this wavelength range for in-band EUV, e.g. x-rays, VUV, DUV, visible and IR.

One advantage of the lithographic apparatus of the invention is that, when e.g. applying EUV radiation, one or more selected from out-band EUV radiation, VUV radiation and DUV radiation may be diminished relatively more than the desired EUV radiation (EUV in-band radiation). In this way, a gaseous optical filter function is provided, that may filter out at least part of the undesired radiation, while leading to a smaller or no loss in intensity of at least part of the desired (e.g. EUV) radiation than is for example the case with state of the art optical filters (like those of EP 1197803).

In a specific embodiment, the invention is directed to a lithographic apparatus, wherein the desired radiation includes EUV radiation, wherein the beam of radiation includes EUV radiation and wherein the transmissive gas includes an EUV transmissive gas. In yet another embodiment of the invention, the desired radiation includes in-band EUV radiation; undesired radiation is all radiation (out-band) having wavelengths other than 10-16 nm.

In an embodiment of the invention, this gas substantially transmissive for at least part of the desired radiation and substantially less transmissive for at least part of the undesired radiation is a gas that substantially absorbs undesired radiation.

In an embodiment, the invention is directed to a lithographic apparatus, wherein at least a part of the lithographic apparatus includes at least about 0.1 Pa·m of EUV transmissive gas. In another embodiment of the invention, there is provided a lithographic apparatus, wherein at least a part of the lithographic apparatus includes at least about 1 Pa·m of EUV transmissive gas, Pa·m being the pressure integrated over a length of the beam of radiation traversing the part of the apparatus comprising the EUV transmissive gas, wherein the length is in meters [m] and the pressure is in Pascal [Pa]. Further, e.g. 1 Pam equals 0.01 mbarm, wherein the pressure is given in "mbar", and the length in "m". For example, 10 Pa·m (0.1 mbar·m) of He can be achieved when a beam of radiation traverses 1 meter through a volume with a pressure of 10 Pa (0.1 mbar) He, or for example, when the optical path length is 0.5 m through a volume with 20 Pa (0.2 mbar) of He. Absorption, especially of undesired radiation, becomes significant from about 0.1 Pa·m for argon and nitrogen; for helium this number is from about 1 Pa·m. This attenuation appears to depend on the gas atoms absorbing and is small for light gasses (e.g. helium) en higher for heavier gases (e.g. argon, nitrogen).

In a further embodiment, the invention is directed to a lithographic apparatus, wherein the lithographic apparatus includes EUV transmissive gas in the range of about 0.1-100 Pa·m. In another embodiment of the invention, there is provided a lithographic apparatus, wherein the lithographic apparatus includes EUV transmissive gas in the range of about 1-100 Pa·m.

When the beam of radiation traverses with such a length times pressure value, DUV radiation, VUV radiation, etc., may advantageously be reduced, whereas in-band EUV radiation is substantially not or only relatively weakly reduced. Hence, in an exemplary embodiment, the invention is directed to a lithographic apparatus, wherein the undesired radiation includes radiation selected from at least one of out-band EUV radiation, VUV radiation and DUV radiation.

In another exemplary embodiment, the invention is directed to a lithographic apparatus, wherein the EUV transmissive gas includes a gas selected from at least one of He, Ne, Ar, Kr, Xe, $N_2$, CO, $CO_2$ and $O_2$. These gasses provide the desired optical filter function, but are also inert. For example, in one embodiment, the invention is directed to a lithographic apparatus, wherein at least a part of the lithographic apparatus includes at least about 0.1 Pa·m of Ar, e.g. between about 0.1-10 Pa·m Ar, like e.g. about 1-10 Pa·m of Ar. In yet another embodiment, the invention is directed to a lithographic apparatus, wherein at least a part of the lithographic apparatus includes at least about 1 Pa·m of He, e.g. between about 1-100 Pa·m of He, like e.g. about 10-100 Pa·m, and in yet a next embodiment, the invention is directed to a lithographic apparatus, wherein at least a part of the lithographic apparatus includes at least about 0.1 Pa·m of $N_2$, e.g. between about 0.1-10 Pa·m of $N_2$, like e.g. about 1-10 Pa·m of $N_2$.

The gaseous optical filter can be used in different optical apparatus, and in different parts of such optical apparatus. In an embodiment, the invention is directed to a lithographic apparatus, wherein at least a part of the lithographic apparatus includes the EUV transmissive gas, wherein the lithographic apparatus includes a collection chamber, and wherein the part of the lithographic apparatus including the EUV transmissive gas is selected from at least one of the collection chamber, the illumination system and the projection system. In a specific embodiment, the EUV transmissive gas is included in the collection chamber. In such an embodiment, advantageously undesired radiation is at least partly filtered out at an early stage, leading to less potential damage of other (non-gaseous) optical filters or optical elements and leading to better imaging properties. In another embodiment, the part of the lithographic apparatus including an EUV transmissive gas, includes the collection chamber, the illumination system and the projection system.

In a specific embodiment, the invention is directed to a lithographic apparatus, wherein the at least one of the collection chamber, illumination system and projection system has a gas pressure of the EUV transmissive gas of at least about 0.01 Pa of EUV transmissive gas, e.g. about 0.01-10 Pa of EUV transmissive gas, like e.g. about 0.01-10 Pa or about 0.1-100 Pa, e.g. about 0.1-10 Pa, depending e.g. on the kind of EUV transmissive gas or combination of EUV transmissive gasses.

In another embodiment, the invention is directed to a lithographic apparatus, wherein at least a part of the lithographic apparatus includes the EUV transmissive gas, wherein the lithographic apparatus includes a collection chamber, and wherein the part of the lithographic apparatus including the EUV transmissive gas is a dynamic gas lock selected from at least one of a first dynamic gas lock between the collection chamber and the illumination system, a second dynamic gas lock between the illumination system and projection system, and a third dynamic gas lock between the projection system and the substrate table. For example, this can be a gas lock based on the gas locks described in e.g. U.S. Pat. No. 6,459,472, which is incorporated herein by reference. In a further embodiment, the invention is directed to a lithographic apparatus, wherein the dynamic gas lock includes at least 1 Pa·m of EUV transmissive gas, e.g. at least 2 Pa·m, like 1-100 Pa·m, e.g. 2-100 Pa·m.

According to another embodiment of the invention, there is provided a method for diminishing an intensity of undesired radiation in a beam of radiation in an optical system, the optical system including a source for providing radiation, the radiation including desired radiation having a predetermined wavelength or a predetermined wavelength range, and undesired radiation having another wavelength or wavelength range, characterized by providing in the beam of radiation a gas substantially transmissive for at least part of the desired radiation and substantially less transmissive for at least part of the undesired radiation.

In another embodiment of the invention, there is provided a method for diminishing an intensity of undesired radiation in a beam of radiation in an optical system, the optical system comprising a source configured to provide radiation, the radiation comprising desired radiation having a predetermined wavelength or a predetermined wavelength range, and undesired radiation having another wavelength or another wavelength range, the method including introducing into the beam of radiation a gas substantially transmissive for at least part of the desired radiation and substantially less transmissive for at least part of the undesired radiation.

The advantage of such a method for diminishing an intensity of undesired radiation in a beam of radiation in an optical system according to the invention is that, when e.g. applying EUV radiation, one or more selected from out-band EUV radiation, VUV radiation and DUV radiation may be diminished relatively more than the desired EUV radiation (EUV in-band radiation). In this way, a gaseous optical filter function is provided, that may filter out at least part of the undesired radiation, while leading to a smaller or no loss in intensity of at least part of the desired (e.g. EUV) radiation than is for example the case with state of the art optical filters (like those of EP 1197803).

In another embodiment, the invention is directed to a method, wherein the desired radiation includes EUV radiation, wherein the beam of radiation includes EUV radiation and wherein the transmissive gas includes an EUV transmissive gas.

In a specific embodiment, the invention is directed to a method wherein the undesired radiation includes radiation selected from at least one of out-band EUV radiation, VUV radiation and DUV radiation.

In yet another embodiment, the invention is directed to a method wherein at least part of the optical system includes the EUV transmissive gas, the method further including providing in the beam of radiation at least about 0.1 Pa·m of EUV transmissive gas, Pa·m being the pressure integrated over a length of the beam of radiation traversing the part of the optical system comprising the EUV transmissive gas.

Further, the method for diminishing an intensity of undesired radiation in a beam of radiation in an optical system according to the invention is, in analogy to the herein mentioned embodiments of the lithographic apparatus of the invention, also directed to e.g. an embodiment, wherein at least a part of the optical system includes at least about 0.1 Pa·m of Ar; an embodiment, wherein at least a part of the optical system includes at least about 1 Pa·m of He; an embodiment, wherein at least a part of the optical system includes at least about 0.1 Pa·m of $N_2$. Further, the optical system that is used in this method may e.g. be a lithographic apparatus, e.g. the lithographic apparatus of the invention as described herein.

The above-mentioned method for diminishing an intensity of undesired radiation in a beam of radiation in an optical system can advantageously be applied in a device manufacturing method. Hence, in yet another aspect of the invention, the invention is also directed to a device manufacturing method including providing a source for providing radiation, the radiation including desired radiation having a predetermined wavelength or a predetermined wavelength range, and undesired radiation having another wavelength or wavelength range;

providing a substrate;

providing a projection beam of radiation using an illumination system;

using a patterning structure to impart the projection beam with a pattern in its cross-section;

projecting the patterned beam of radiation onto a target portion of the substrate; characterized by providing in the beam of radiation a gas substantially transmissive for at least part of the desired radiation and substantially less transmissive for at least part of the undesired radiation.

In another embodiment of the invention, there is provided a device manufacturing method including:

providing a beam of radiation, the beam of radiation comprising desired radiation having a predetermined wavelength or a predetermined wavelength range, and undesired radiation having another wavelength or another wavelength range;

patterning the beam of radiation according to a desired pattern;

projecting the patterned beam of radiation onto a target portion of the substrate; and introducing, into the beam of radiation, a gas substantially transmissive for at least part of the desired radiation and substantially less transmissive for at least part of the undesired radiation.

In analogy to the embodiments mentioned herein with respect to the lithographic apparatus and method for diminishing of the invention, the invention is also directed to e.g. an embodiment of the device manufacturing method, wherein the desired radiation includes EUV radiation, wherein the beam of radiation includes EUV radiation and wherein the transmissive gas includes an EUV transmissive gas; or to an embodiment, wherein the undesired radiation includes radiation selected from at least one of out-band EUV radiation, VUV radiation and DUV radiation.

In yet another embodiment of the device manufacturing method of the invention, the invention is directed to a method, wherein a lithographic apparatus is used, wherein at least part of the lithographic apparatus includes the EUV transmissive gas and wherein the method further includes providing in the beam of radiation at least about 0.1 Pa·m of EUV transmissive gas, Pa·m being the pressure integrated over a length of the beam of radiation traversing the part of the apparatus including the EUV transmissive gas. In analogy to the embodiments mentioned herein with respect to the lithographic apparatus and method for diminishing of the invention, the invention is also directed to e.g. an embodiment of the device manufacturing method of the invention, wherein at least a part of the optical system includes at least about 0.1 Pa·m of Ar; an embodiment, wherein at least a part of the optical system includes at least about 1 Pa·m of He; an embodiment, wherein at least a part of the optical system includes at least about 0.1 Pa·m of $N_2$. Further, the optical system that is used in this method, may e.g. be the lithographic apparatus of the invention. The lithographic apparatus used in this device manufacturing method may include a collection chamber, an illumination system and a projection system, etc.

In an embodiment of the invention, there is provided a dynamic gas lock including:
  a hollow elongated body including a first end and a second end, the body extending radially around a path of a beam of radiation from the first end to the second end; and
  a gas flushing unit in communication with the body and configured to supply a gas within the body,
  wherein the beam of radiation includes desired and undesired radiations and the gas is substantially transmissive for at least part of the desired radiation and substantially less transmissive for at least part of the undesired radiation.

In a further aspect of the invention, the invention is directed to the use of a gas as optical filter in a beam of radiation of an optical system, the optical system including a source for providing radiation, the radiation including desired radiation having a predetermined wavelength or a predetermined wavelength range, and undesired radiation having another wavelength or wavelength range, and wherein the gas used as optical filter is a gas substantially transmissive for at least part of the desired radiation and substantially less transmissive for at least part of the undesired radiation. In a specific embodiment, the invention is directed to a method, wherein the desired radiation includes EUV radiation, wherein the beam of radiation includes EUV radiation and wherein the transmissive gas includes an EUV transmissive gas.

In addition to the advantages mentioned above, a further advantage is that the gas can be used to stop, trap or diminish debris, e.g. from an EUV source, traveling along the beam of radiation, from reaching the substrate, or from reaching other optical elements (like gratings, mirrors, lenses). Hence, the transmissive gas can be used as both optical filter and as a structure for at least one of stopping and trapping of debris from the beam of radiation and reducing sputtering due to the debris. However, the gas may also advantageously be used to stop, trap or diminish debris sputtering from the substrate when being irradiated with the beam of radiation.

According to yet another aspect of the invention, there is provided a device which is manufactured according to the device manufacturing method of the invention or with the lithographic apparatus according to the invention.

"Transmissive" or "substantially transmissive" in this context means that the transmission through a gas (transmissive for at least part of the desired radiation), e.g. an EUV transmissive gas, is larger than zero, preferably e.g. at least about 30%, or at least about 50%, at least about 70%, at least about 80%, e.g. at least about 90% or at least about 95%, more preferably at least about 98%. Consequently, "absorbed" means that the absorption is larger than zero, preferably e.g. at least about 30%, or at least about 50%, at least about 70%, at least about 80%, e.g. at least about 90% or at least about 95%, more preferably at least about 98%. The terms "EUV transmissive" or "transmissive for EUV radiation" mean that the gas is transmissive for at least part of the EUV radiation (especially in-band EUV). This can e.g. be a gas substantially transmissive for radiation with a predefined in-band wavelength in the range of about 12-14 nm.

The phrases "less transmissive" or "substantially less transmissive" in the context of the invention mean that the gas has a smaller transmission for a wavelength, a wavelength range or wavelength ranges with respect to the transmission of radiation with undesired wavelengths. Each gas, having a transmission for at least part of the desired radiation (like e.g. in-band EUV radiation) which is larger than for at least part of the undesired radiation can be used as optical filter. However, it should be appreciated that those gasses are chosen that have a substantial larger transmission for at least part of the desired radiation than for at least part of the undesired radiation, e.g. a transmission difference of e.g. about 30%, like e.g. about 50%. However, it is to be mentioned that such difference only refers to certain wavelengths, like e.g. a transmission difference of about 30% between the transmission at 13.5 nm and 35 nm, which is e.g. the case when a pressure of about 0.01 mbar·m (1 Pam) of $N_2$ is present (Pa·m being the pressure integrated over a length of the beam of radiation traversing the part of the apparatus comprising the EUV transmissive gas), see also FIG. 3. In the context of the invention, the term "at least part of the radiation" refers to at least part of a spectral wavelength range. A gas can be substantially transmissive or substantially less transmissive or substantially absorb radiation in one or more different wavelength ranges.

The transmission of the gasses depends amongst others on the pressure of the gas and the path length that the beam of radiation traverses. Values of pressures in Pa or Pa·m may be given in values like "at least 0.1 Pa·m" or at least 0.01 Pa". A pressure can be chosen such that the desired filter function is obtained and enough radiation intensity of desired radiation of the beam of radiation is obtained.

"Not absorbed" or "substantially not absorbed" in this context means that the absorption of radiation is less than about 100%, preferably less than e.g. about 70%, or less than about 50%, or less than about 30%, less than about 20%, e.g. less than about 10% or less than about 5%, more preferably less than about 2%. It should be appreciated that, "transmissive", "absorbed" as well as "not absorbed" depend not only on the transmission or absorbance of the gas, but also on other factors like e.g. path length of the beam of radiation traversing through the gas.

Here, "transmissive", "absorbed" as well as "not absorbed" refers to a wavelength, a wavelength range or wavelength ranges. In the context of the invention, a gas less transmissive for VUV radiation, which may be applied according to the invention, can however be transmissive for parts of UV or DUV radiation. In this sense, the terms transmissive", "absorbed" and "not absorbed" have to be understood as related to at least part of the desired radiation or at least part of the undesired radiation.

The gasses in the context of the invention are those gasses that can be used as optical filter to improve the ratio of desired radiation, or at least part of the desired radiation, over the undesired radiation, or at least part of the undesired radiation. For EUV applications, with EUV wavelengths of 5-20 nm, such a gas includes a gas selected from at least one of He, Ne, Ar, Kr, Xe, N2, CO, CO2 and O2. This includes also combination of gasses. Hence, values related to pressure like those expressed in Pa (mbar) or in Pa·m (mbar·m) are either related to a gas or related to a combination of gasses, wherein the gasses are gasses according to the invention. Others gasses, as mentioned above can be used when they are also able to fulfill a filter function. Preferably, the gasses are inert. In case combinations of gasses are used, it should be appreciated that absorbencies and differences in absorbencies of the gasses have to be taken into account.

In the context of the invention, "optical system" may e.g. include a lithographic apparatus. An optical system may include different components, for example a collection chamber, an illumination system and a projection system, but also a first dynamic gas lock between the collection chamber and the illumination system, a second dynamic gas lock between the illumination system and projection system, and a third dynamic gas lock between the projection system and the substrate table. Each component has a certain volume, filled with a gas, a combination of gasses, or is substantially vacuum. Further, the optical system, when including different components, each having a certain volume, may also include intermediate spaces or volumes, traversed by the beam of radiation.

The phrases "at least a part of the optical system" or "at least a part of the lithographic apparatus" indicate that such optical system or lithographic apparatus may include one or more compartments or intermediate spaces (both may be indicated with volumes) which may include the gas substantially transmissive for at least part of the desired radiation and substantially less transmissive for at least part of the undesired radiation. In case more than one of such compartment and intermediate space is present, one or more of them may include this gas. The compartment, the compartments, the intermediate space or the intermediate spaces, respectively, are chosen to include this gas. The value of the pressure integrated over the optical path length is estimated by integrating the pressure over the optical path length (e.g. of the projection beam, especially the central ray of the projection beam) in each volume including the transmissive gas.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "patterning structure" used herein should be broadly interpreted as referring to a structure that can be used to impart a projection beam with a pattern in its cross-section such as to create a pattern in a target portion of the substrate. It should be noted that the pattern imparted to the projection beam might not exactly correspond to the desired pattern in the target portion of the substrate. Generally, the pattern imparted to the projection beam will correspond to a particular functional layer in a device being created in the target portion, such as an integrated circuit.

Patterning structures may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning structure. It holds the patterning structure in a way depending on the orientation of the patterning structure, the design of the lithographic apparatus, and other conditions, such as for example whether or not the patterning structure is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning structure is at a desired position, for example with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
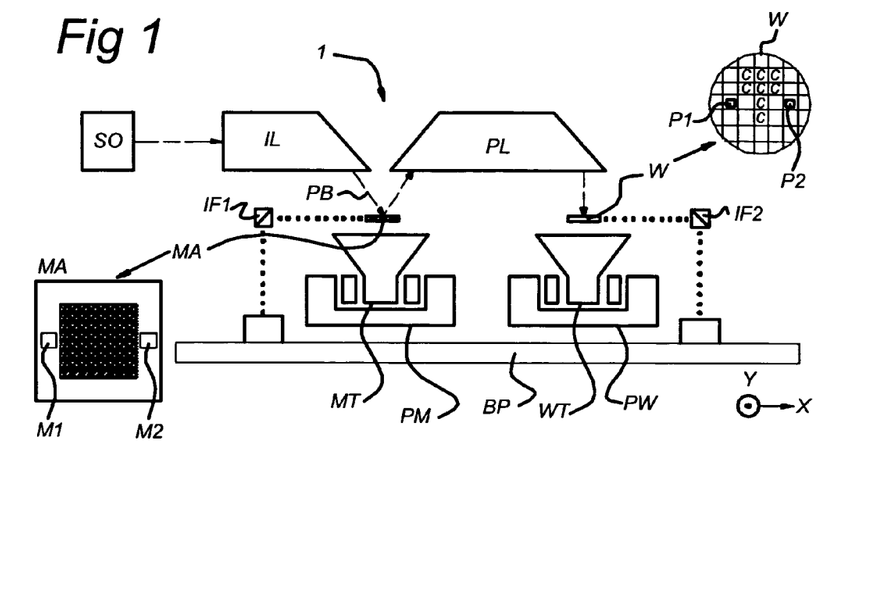
FIG. 1 schematically depicts a lithographic apparatus according to an embodiment of the invention.

FIG. 1 schematically depicts a lithographic apparatus according to an embodiment of the invention. The apparatus includes an illumination system (illuminator) IL configured to provide a projection beam PB of radiation (e.g. UV or EUV radiation), a first support structure (e.g. a mask table) MT configured to support patterning structure (e.g. a mask) MA and connected to first positioning device PM configured to accurately position the patterning device with respect to a projection system ("lens") PL; a substrate table (e.g. a wafer table) WT configured to hold a substrate (e.g. a resist-coated wafer) W and connected to second positioning device PW configured to accurately position the substrate with respect to the projection system PL; and a projection system (e.g. a reflective projection lens) PL configured to image a pattern imparted to the projection beam PB by patterning structure MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector including for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may include an adjusting device configured to adjust the angular intensity distribution of the beam. Generally, at least the outer and/or inner radial extent (commonly referred to as v-outer and v-inner, respectively) of the intensity distribution in a pupil plane of the illuminator can be adjusted. The illuminator provides a conditioned beam of radiation, PB having a desired uniformity and intensity distribution in its cross-section.

The beam PB is incident on the mask MA, which is held on the mask table MT. Being reflected by the mask MA, the beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above-described modes of use or entirely different modes of use may also be employed.

Figure 2:
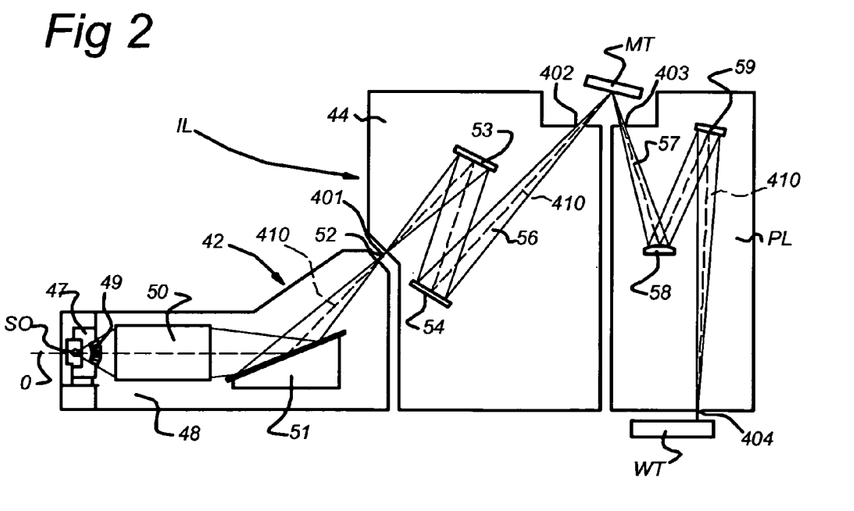
FIG. 2 schematically depicts a side view of an EUV illumination system and projection optics of a lithographic projection apparatus according to FIG. 1.

FIG. 2 shows the projection apparatus 1 in more detail, including a radiation system 42, an illumination optics unit 44, and the projection system PL. The radiation system 42 includes the radiation source SO which may be formed by a discharge plasma. EUV radiation may be produced by a gas or vapor, such as Xe gas or Li vapor in which a very hot plasma is created to emit radiation in the EUV range of the electromagnetic spectrum. The very hot plasma is created by causing a partially ionized plasma of an electrical discharge to collapse onto an optical axis O. Partial pressures of e.g. 10 Pa of Xe or Li vapor or any other suitable gas or vapor may be required for efficient generation of the radiation. The radiation emitted by radiation source SO is passed from a source chamber 47 into a collector chamber 48, e.g. via a gas barrier structure or contamination trap 49 (which is positioned in or behind an opening in source chamber 47). The gas barrier structure 49 includes a channel structure such as, for instance, described in European patent application EP 1 057 079 or EP 1 223 468, which are incorporated herein by reference.

The collector chamber 48 includes a radiation collector 50 which may be formed by a grazing incidence collector. Radiation passed by collector 50 is reflected off a grating spectral filter 51 to be focused in a virtual source point 52 at an aperture 401 in the collector chamber 48. From collector chamber 48, a projection beam 56 is reflected in illumination optics unit 44 via normal incidence reflectors 53, 54 onto a reticle or mask positioned on reticle or mask table MT. A patterned beam 57 is formed which is imaged in projection optics system PL via reflective elements 58, 59 onto wafer stage or substrate table WT. More elements than shown may generally be present in illumination optics unit 44 and projection system PL.

Radiation collectors 50 are known from the prior art. One example of a radiation collector that may be used in the present invention is, e.g., described in patent application EP 1186957, incorporated herein by reference.

Referring still to FIG. 2, the collection chamber 48, the illumination optics 44 and the projection system PL include a gas according to the invention, such that the optical path length of the projection beam 56 (beam of radiation) in the gas, starting form the contamination trap 49 (positioned in or behind an opening in source chamber 47) to the wafer on wafer table WT provides a gas pressure times path length of e.g. about 0.1-10 Pa·m. The shortest length of a central ray within the projection beam is chosen as length. By way of example, this is shown in FIG. 2 by the dotted line 410 (the "central ray", which starts at contamination trap 49 (note that part of central ray 410 coincides with optical axis O), traveling to the center of grating spectral filter 51, normal incidence reflectors 53 and 54, being projected at the mask, further traveling to the center of reflective elements 58 and 59 and then being projected on the substrate WT).

Here, when calculating the length of the central ray 410 in the collection chamber, the length of the central ray 410 in the collection chamber 48 does not include the length in the source chamber 47, but starts after the source chamber 47, at contamination trap 49 (if present). The local pressure in the collection chamber 48, the illumination optics 44 and the projection optics system PL (but also intermediate volumes, for example between collection chamber 48 and illumination system 44, between illumination system 44 and projection system PL, and between projection system PL and substrate or wafer WT) may be at least about 0.01 Pa of EUV transmissive gas ($10^{-3}$ mbar) (assuming an EUV lithographic apparatus).

According to an embodiment of the invention, a lithographic apparatus according to FIG. 2 is used. This can be, e.g., a lithographic apparatus for EUV applications, wherein the EUV transmissive gas includes a gas selected from at least one of He, Ne, Ar, Kr, Xe, N2, CO, CO2 and O2. In variations on this embodiment, the pressure times path length value depends upon the gasses used. For example, a lithographic apparatus may be used, wherein at least a part of the lithographic apparatus includes at least about 0.1 Pa·m of Ar, or wherein at least a part of the lithographic apparatus includes at least about 1 Pa·m of He, or wherein at least a part of the lithographic apparatus includes at least about 0.1 Pa·m of N2. This means that the pressure distribution in the whole apparatus is such, that when the pressure integrated over the optical path length (410) is calculated, these mbar·m values are obtained.

Figure 3:
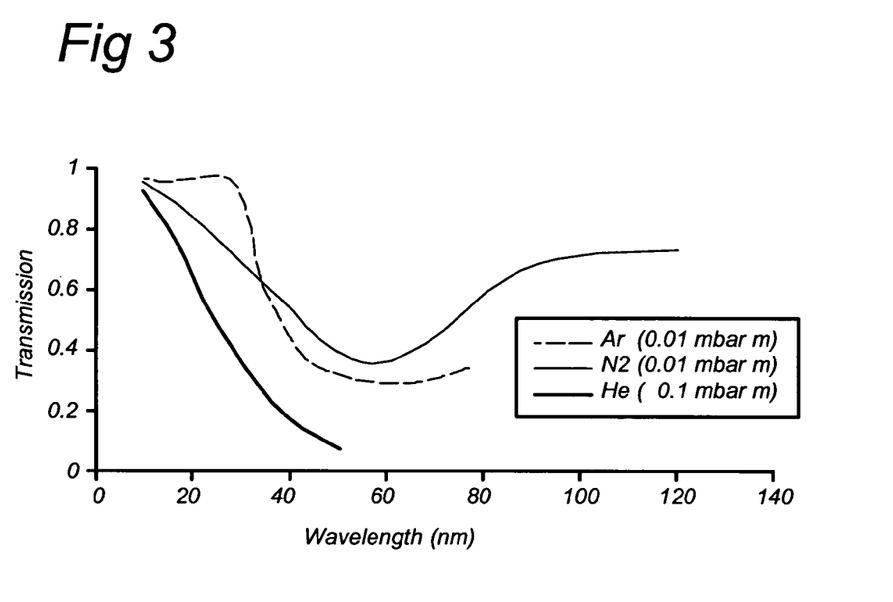
FIG. 3 schematically depicts the transmission of a number of gasses that can be applied according to the invention.

A schematic drawing of the transmission for such values is shown in FIG. 3 (calculated for 1 m). On the y-axis, the transmission in given from 0-1, corresponding to 0-100% transmission. On the x-axis, the wavelength in nm is given.

From FIG. 3 it can be derived that about 1 Pa·m (0.01 mbar·m) of Ar leads to a high transmission between about 10 and about 40 nm, and the gas is less transmissive from about 40 nm up to about 80 nm (transmission at larger wavelengths were not determined for Ar). Ar has advantageously a steep slope. From FIG. 3, it can also be derived that about 1 Pa·m (0.01 mbar·m) of $N_2$ leads to a high transmission between about 10 and about 20 nm, and the gas is less transmissive from about 20 nm up to about 60 nm, with a decreasing transmission with wavelengths increasing to about 60 nm. From about 60 nm, the transmission increases again and, thus, the gas becomes more transmissive for less desired radiation (assuming a EUV application). Transmission for wavelengths larger than 120 nm were not calculated for $N_2$.

Finally, from FIG. 3 it can be derived that about 10 Pa·m (0.1 mbar·m) of He has a high transmission around about 10 nm, with a constant decrease in transmission from about 10 nm to about 50 nm (transmission at larger wavelengths were not determined for He). He has also advantageously a steep slope.

According to another embodiment of the invention, the gasses are mainly present in the collection chamber 48, and the rest of the apparatus is substantially vacuum and has mainly a pressure of below about $1.10^{-5}$ mbar ($1.10^{-3}$ Pa). An advantage of using the transmissive gas mainly in the collection chamber 48 is that most of the undesired radiation will not reach other optical elements further in the apparatus, like mirrors 53, 54, etc. In this embodiment, the integration of the pressure over the optical path length is done in the volume of the collection chamber 48, where the beam or radiation traverses the transmissive gas.

For example, the pressure in the collection chamber 48, can be, e.g., between about 0.1-10 Pa·m of Ar, or e.g., between about 1-100 Pa·m of He, or e.g., between about 0.1-10 Pa·m of $N_2$. Also, combinations of gasses can be used, such that the desired filter function is obtained.

According to another embodiment of the invention, at least a part of the lithographic apparatus includes the EUV transmissive gas, wherein the lithographic apparatus includes a collection chamber, and the part of the lithographic apparatus including the EUV transmissive gas is a dynamic gas lock selected from at least one of a first dynamic gas lock between the collection chamber and the illumination system, a second dynamic gas lock between the illumination system and projection system, and a third dynamic gas lock between the projection system and the substrate table.

Figure 4:
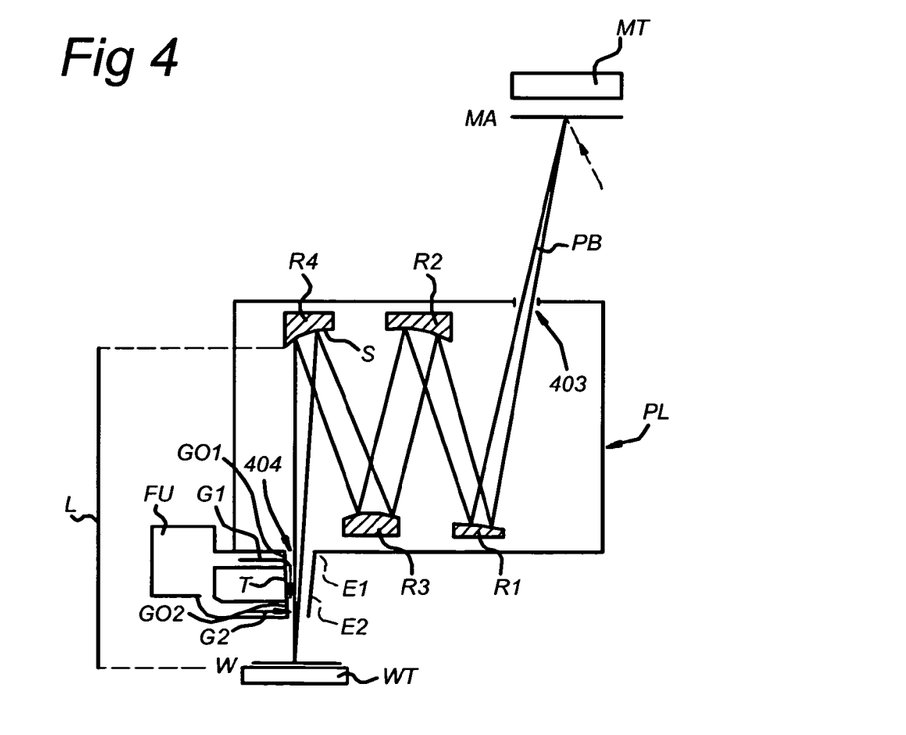
FIG. 4 schematically depicts a side view of another embodiment of the projection optics of a lithographic projection apparatus.

This is further demonstrated in FIG. 4, which shows by way of example an embodiment of part of an apparatus as depicted in FIG. 1, and demonstrates how the present invention, when using a gas lock, can be applied therein. The beam PB coming (e.g. reflected) from the mask MA on mask table MT passes through the projection system PL before impinging on the substrate W located on the substrate table WT. In this embodiment however, the projection system PL is depicted with four reflectors (mirrors) R1, R2, R3, R4 (note that FIG. 2 shows by way of example 2 reflective optics 58 and 59) which serve to focus the beam PB.

In this particular instance, the projection system PL is located in an enclosure, as is also the case in FIG. 2, which is provided with an aperture 403 and an aperture 404 to allow entrance and exit of the beam PB. The projection system PL is separated from the substrate table WT by an intervening space L. This space L is delimited at the location of the projection system PL by the solid reflecting surface S of the "final" mirror R4 in the system PL. It is noted that it is from the mirror R4 that radiation is finally directed toward the substrate W. The space L contains a hollow tube T which is positioned around the path of the radiation beam PB on its way from the surface S to the substrate table WT. This tube T is thus formed, sized and positioned that its walls do not intercept the beam PB. In this embodiment, the tube T is embodied as a continuation of the enclosure B, projecting outward from the exit aperture 404. Moreover, as here depicted, the tube T tapers in the direction of the substrate table WT (although other shapes are possible).

According to an embodiment of the invention, the tube T may (temporarily) contain a gas over such an optical path length with such a pressure, that the gas is not only substantially transmissive for at least part of the EUV radiation, but is also substantially less transmissive for at least part of the undesired radiation. The gas may be flushed through the tube T in the direction of the substrate W. This can be achieved, for example, by using a flushing unit FU to introduce a downward flow of the gas G into the tube T in proximity to its top rim E1 through opening GO1 or at some point E2 through opening GO2 between its top and bottom rims. In the case of introduction at such a latter intermediate position E2, part of the flow may be downward and part may be upward, for example. A similar gas lock, comprising tube T, flushing unit FU, including structures configured to introduce one or more gasses at one or more positions (like GO1, GO2 and intermediate position E2) in the tube and optionally structures configured to at least partly evacuate tube T, may also be provided at aperture 403, or other apertures.

For example, in FIG. 2, the apertures in the different parts of the apparatus are indicated with references 401-404, respectively. At these places, gas locks may be used, such as gas locks based on the gas locks described in e.g. U.S. Pat. No. 6,459,472, which is incorporated herein by reference. Gas locks are openings like hollow tubes T, creating an intervening space, between two parts of an optical system. Gas locks can be flushed by the use of a flushing unit FU with a gas, e.g. bidirectional. An aperture with such an intervening space can be at least partially evacuated; the intervening space contains a hollow tube, a form and size of the tube being such that radiation focused by the projection system onto the substrate table does not intercept a wall of the hollow tube. The flushing unit may be constructed and arranged to (continually) flush an inside region defined by the hollow tube with a flow of gas.

Gas locks (also indicated with "second dynamic gas lock") in between the illumination system 44 and the projection system PL can be situated at either apertures 402 or 403, or at both apertures. Depending upon the kind of optical system, especially lithographic apparatus, less or more apertures can be present.

In another embodiment of the invention, the hollow tube T has the form of a cone (see also FIG. 4). Because the projection system serves to focus an image onto the substrate, the radiation emerging from the projection system will taper inwards toward the final image on the wafer. If the employed hollow tube is of a conical form which imitates this tapering, then the tube will have the minimal volume necessary to encapsulate the emergent radiation. This minimizes the flow of gas required to produce an effective flush, leading to materials savings. In addition, the gas load to the system is reduced.

In another embodiment of the invention, the gas is introduced into the hollow tube T via at least one opening in a wall of the tube (thereby providing e.g. gas stream G1 (through opening GO1) or G2 (through opening GO2) or both). Alternatively, the gas can, for example, be introduced over a top rim (E1) of the tube, or at other points (e.g. indicated with E2). The opening GO1 or GO2, or both openings, or alternatively the whole tube T, may include a region which is porous to the employed gas or gas mixture.

In yet another embodiment of the invention, the flushing units are embodied such that the flush of gas in the hollow tube is at least partially directed towards the substrate table WT. The very presence of gas at all (whether static or dynamic) between the substrate W and the projection system provides a scattering barrier to debris migrating from the substrate W, next to the optical filter function. However, if such gas is additionally moved toward the substrate W, then this provides an additional safeguard against such debris reaching the projection system PL. It should be noted that the flush need not be directed in its entirety towards the substrate W: for example, if the gas is introduced via an opening in the wall of the tube located at some point (e.g. half way like E2) between its upper and lower limits (rims), then some of the gas can flow from the hole upwards (toward the projection system). This gas lock is positioned at 404, between substrate table WT and projection system PL. The gas lock at 404 may provide a value of the path length times pressure of at least 1 Pa·m EUV transmissive gas. Here, the pressure is integrated over the optical path length of the beam of radiation in the volume of the gas lock.

In another embodiment, a gas lock is present on position 401 (also first dynamic gas lock, with a gas flow directed from illumination system IL towards the collection chamber 48, thereby providing an optical filter function and a reduction of transport of possible debris from the source (in source chamber 47) from the collection chamber 48 into the illumination system IL and the rest of the apparatus.

In another embodiment, the presence of transmissive gasses in the collection chamber 48, the illumination optics 44 (IL) and the projection optics system PL, as well as in possible gas locks at 401 (first dynamic gas lock), 402 and 403 (second dynamic gas locks) provide a value of the optical path length times the pressure of at least about 0.1 Pa·m of EUV transmissive gas (e.g. EUV transmissive), e.g. at least about 1 Pa·m of transmissive gas.

Some of the embodiments especially describe EUV applications and EUV optical elements. However, the invention can also be applied to optical systems for other spectral ranges, like e.g. DUV, VUV, UV or VIS. The invention is not limited to applications of the lithographic apparatus or use in the lithographic apparatus as described in the embodiments. The invention may also be used in transmissive lithographic apparatus, wherein, e.g., no separate collection chamber is present. Further, the drawings include the elements and features that are necessary to understand the invention. Beyond that, the drawings of the lithographic apparatus are schematic and not to scale. The invention is not limited to those elements shown in the schematic drawings. For example, it should be appreciated that structures configured to provide gas, for example gas inlets, pumps, vacuum pumps, conduits, jets, valves, structures configured to control gas pressures like pressure meters, sensors, etc. can be provided to introduce, control, remove, etc. the transmissive gasses, and control their (partial) pressure in the optical system, like the lithographic apparatus of the invention. Further, the use of transmissive gasses according to the invention does not exclude the use of other gasses. Further, the invention is not limited to the embodiments described herein. The invention is also directed to combinations of embodiments described herein.

What is claimed is:

1. A lithographic apparatus comprising:
    an illumination system configured to transmit a beam of radiation, the beam of radiation comprising desired radiation having a predetermined wavelength or a predetermined wavelength range, and undesired radiation having another wavelength or another wavelength range;
    a support structure configured to support a patterning structure, the patterning structure being configured to impart the beam of radiation with a pattern in its cross-section;
    a substrate table configured to hold a substrate; and
    a projection system configured to project the patterned beam of radiation onto a target portion of the substrate;
    wherein at least part of the lithographic apparatus, during substrate exposure, comprises a gas substantially transmissive for at least part of the desired radiation and substantially less transmissive for at least part of the undesired radiation, said part of the lithographic apparatus including the illumination system and/or the projection system.

2. A lithographic apparatus according to claim 1, wherein the desired radiation comprises EUV radiation and the transmissive gas comprises an EUV transmissive gas.

3. A lithographic apparatus according to claim 2, wherein at least a part of the lithographic apparatus comprises at least about 0.1 Pa·m of EUV transmissive gas.

4. A lithographic apparatus according to claim 3, wherein at least a part of the lithographic apparatus comprises at least about 0.1 Pa·m of Ar.

5. A lithographic apparatus according to claim 3, wherein at least a part of the lithographic apparatus comprises at least about 1 Pa·m of He.

6. A lithographic apparatus according to claim 3, wherein at least a part of the lithographic apparatus comprises at least about 0.1 Pa·m of $N_2$.

7. A lithographic apparatus according to claim 3, wherein at least a part of the lithographic apparatus comprises at least about 1 Pa·m of EUV transmissive gas.

8. A lithographic apparatus according to claim 2, wherein the EUV transmissive gas comprises a gas selected from at least one of He, Ne, Ar, Kr, Xe, $N_2$, CO, $CO_2$ and $O_2$.

9. A lithographic apparatus according to claim 2, further comprising a collection chamber, and wherein the part of the lithographic apparatus comprising the EUV transmissive gas is selected from at least one of the collection chamber, the illumination system or the projection system.

10. A lithographic apparatus according to claim 9, wherein the at least one of the collection chamber, illumination system and projection system has a EUV transmissive gas pressure of at least about 0.01 Pa.

11. A lithographic apparatus according to claim 2, wherein the undesired radiation comprises radiation selected from at least one of out-band EUV radiation, VUV radiation and DUV radiation.

12. A lithographic apparatus according to claim 1, wherein the desired radiation comprises in-band EUV radiation and the transmissive gas comprises an EUV transmissive gas.

13. A lithographic apparatus according to claim 1, further comprising a source configured to supply the illumination system with radiation.

14. A lithographic apparatus according to claim 1, wherein a transmission difference between the desired radiation and the undesired radiation in said gas is at least about 30%.

15. A lithographic apparatus according to claim 1, wherein the transmission difference is at least 50%.

16. A lithographic apparatus comprising:
an illumination system configured to transmit a beam of radiation, the beam of radiation comprising desired radiation having a predetermined wavelength or a predetermined wavelength range, and undesired radiation having another wavelength or another wavelength range;
a support structure configured to support a patterning structure, the patterning structure being configured to impart the beam of radiation with a pattern in its cross-section;
a substrate table configured to hold a substrate; and
a projection system configured to project the patterned beam of radiation onto a target portion of the substrate; and
a dynamic gas lock selected from at least one of a first dynamic gas lock arranged between a radiation collection chamber and the illumination system, a second dynamic gas lock arranged between the illumination system and the projection system, or a third dynamic gas lock arranged between the projection system and the substrate table,
wherein at least part of the lithographic apparatus, during substrate exposure, comprises a gas substantially transmissive for at least part of the desired radiation and substantially less transmissive for at least part of the undesired radiation, the gas from the gas lock being provided in a direction that is substantially in a same direction as a direction of propagation of the beam of radiation and/or a direction that is substantially opposite to the direction of propagation of the beam of radiation.

17. A lithographic apparatus according to claim 16, wherein the dynamic gas lock comprises at least 0.1 Pa·m of EUV transmissive gas.

18. A lithographic apparatus according to claim 17, wherein the dynamic gas lock comprises at least 1 Pa·m of EUV transmissive gas.

19. A method for diminishing an intensity of undesired radiation in a beam of radiation in an optical system, the optical system comprising a source configured to provide radiation, the radiation comprising desired radiation having a predetermined wavelength or a predetermined wavelength range, and undesired radiation having another wavelength or another wavelength range, the method comprising:
introducing into the beam of radiation a gas substantially transmissive for at least part of the desired radiation and substantially less transmissive for at least part of the undesired radiation, the gas introduced along a direction that is substantially in a same direction as a direction of propagation of the beam of radiation and/or a direction that is substantially opposite to the direction of propagation of beam of radiation.

20. A method according to claim 19, wherein the desired radiation comprises EUV radiation, the beam of radiation comprises EUV radiation and the transmissive gas comprises an EUV transmissive gas.

21. A method according to claim 20, wherein the undesired radiation comprises radiation selected from at least one of out-band EUV radiation, VUV radiation and DUV radiation.

22. A method according to claim 20, wherein at least part of the optical system comprises the EUV transmissive gas, and wherein the introducing comprises introducing into the beam of radiation at least about 0.1 Pa·m of EUV transmissive gas.

23. A method according to claim 22, wherein at least a part of the optical system comprises at least about 0.1 Pa·m of Ar.

24. A method according to claim 22, wherein at least a part of the optical system comprises at least 1 Pa·m of He.

25. A method according to claim 22, wherein at least a part of the optical system comprises at least 0.1 Pa·m of $N_2$.

26. A method according to claim 20, wherein the EUV transmissive gas comprises a gas selected from at least one of He, Ne, Ar, Kr, Xe, $N_2$, CO, $CO_2$ and $O_2$.

27. A method according to claim 19, wherein the optical system is a lithographic apparatus.

28. A device manufacturing method comprising:
providing a beam of radiation with an illumination system, the beam of radiation comprising desired radiation having a predetermined wavelength or a predetermined wavelength range, and undesired radiation having another wavelength or another wavelength range;
patterning the beam of radiation according to a desired pattern;
projecting the patterned beam of radiation onto a target portion of the substrate with a projection system; and
introducing, into the beam of radiation in the illumination system and/or the projection system, a gas substantially transmissive for at least part of the desired radiation and substantially less transmissive for at least part of the undesired radiation.

29. A method according to claim 28, wherein the desired radiation comprises EUV radiation and the transmissive gas comprises an EUV transmissive gas.

30. A method according to claim 29, wherein the undesired radiation comprises radiation selected from at least one of out-band EUV radiation, VUV radiation and DUV radiation.

31. A method according to claim 29, wherein the introducing comprises introducing into the beam of radiation at least about 0.1 Pa·m of EUV transmissive gas.

32. A method according to claim 31, wherein at least a part of the lithographic apparatus comprises at least about 0.1 Pa·m of Ar.

33. A method according to claim 31, wherein at least a part of the lithographic apparatus comprises at least about 1 Pa·m of He.

34. A method according to claim 31, wherein at least a part of the lithographic apparatus comprises at least about 0.1 Pa·m of $N_2$.

35. A method according to claim 29, wherein the EUV transmissive gas comprises a gas selected from at least one of He, Ne, Ar, Kr, Xe, $N_2$, CO, $CO_2$ and $O_2$.

* * * * *